US006233056B1

(12) United States Patent
Naulleau et al.

(10) Patent No.: US 6,233,056 B1
(45) Date of Patent: May 15, 2001

(54) INTERFEROMETRIC AT-WAVELENGTH FLARE CHARACTERIZATION OF EUV OPTICAL SYSTEMS

(75) Inventors: Patrick P. Naulleau, Oakland; Kenneth Alan Goldberg, Berkeley, both of CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/627,533

(22) Filed: Jul. 28, 2000

Related U.S. Application Data

(63) Continuation of application No. 09/300,539, filed on Apr. 27, 1999, now Pat. No. 6,100,978, which is a continuation of application No. 09/176,617, filed on Oct. 21, 1998.

(51) Int. Cl.[7] .................................................... G01B 9/02
(52) U.S. Cl. ............................................ 356/520; 356/521
(58) Field of Search ................................. 356/520, 521, 356/450; 250/237 G

(56) References Cited

U.S. PATENT DOCUMENTS 5,835,217 * 11/1998 Medecki ............................... 356/353

FOREIGN PATENT DOCUMENTS

0064139 * 4/1982 (JP) ....................................... 356/354

OTHER PUBLICATIONS

Kwon, Osak Y., "Multichannel Phase–shifted Interferometer," Reprinted with . . . permission from Optics Letters, vol. 9 (2), pp. 59–61,Feb. 1984, Palo Alto, California.*

Mercer, Carolyn R. & Creath, Katherine, "Liquid–crystal Point–diffraction Interferometer," Optic Letters, vol. 19, No. 12, Jun. 15, 1994.*

Medecki, H. et al., "A Phase–Shifting Point Diffraction Interferometer," Optics Letters, Oct. 1, 1996.*

W. P. Linnik, Proceedings of the Academy of Sciences of the U.S.S.R. 1, 208 (1933).*

R.N. Smartt, W.H. Steel, Japan. J. of Appl. Phys. 14, (Suppl. 14–1), 351 (1975).*

K. A. Goldberg, R. Beguiristain, J. Bokor, H. Medecki, D. T. Attwood, K. Jackson, E. Tejnil, G. E. Sommargren, J. Vac. Sci. Tech. B 13, 2923 (1995).*

* cited by examiner

*Primary Examiner*—Frank G. Font
*Assistant Examiner*—Andrew H. Lee
(74) *Attorney, Agent, or Firm*—Burns, Doane, Swecker & Mathis, L.L.P.

(57) ABSTRACT

The extreme ultraviolet (EUV) phase-shifting point diffraction interferometer (PS/PDI) provides the high-accuracy wavefront characterization critical to the development of EUV lithography systems. Enhancing the implementation of the PS/PDI can significantly extend its spatial-frequency measurement bandwidth. The enhanced PS/PDI is capable of simultaneously characterizing both wavefront and flare. The enhanced technique employs a hybrid spatial/temporal-domain point diffraction interferometer (referred to as the dual-domain PS/PDI) that is capable of suppressing the scattered-reference-light noise that hinders the conventional PS/PDI. Using the dual-domain technique in combination with a flare-measurement-optimized mask and an iterative calculation process for removing flare contribution caused by higher order grating diffraction terms, the enhanced PS/PDI can be used to simultaneously measure both figure and flare in optical systems.

33 Claims, 6 Drawing Sheets

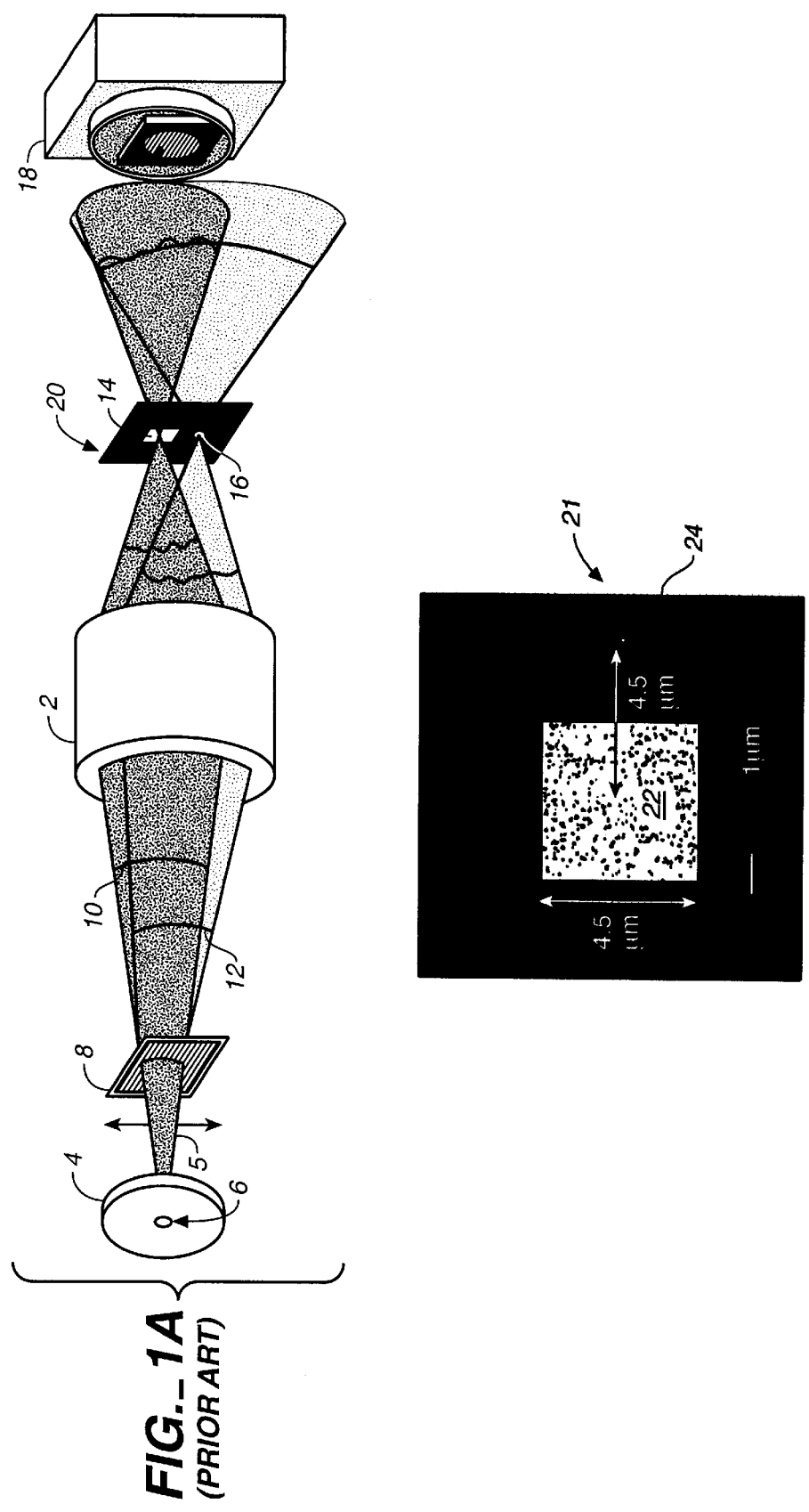
FIG._1A
(PRIOR ART)
FIG._1B
(PRIOR ART)

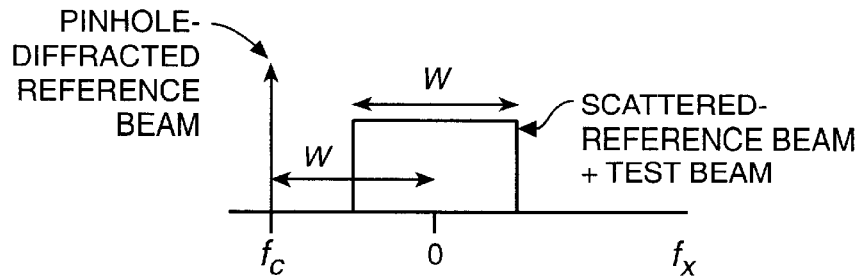
FIG._2A
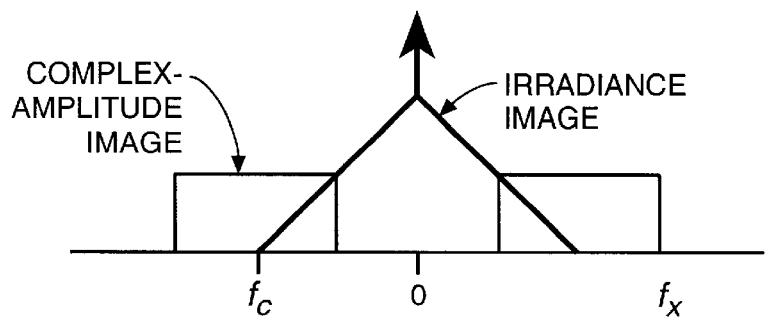
FIG._2B
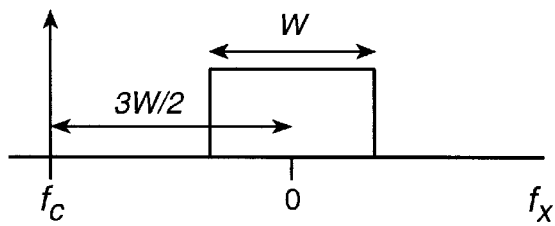
FIG._3A
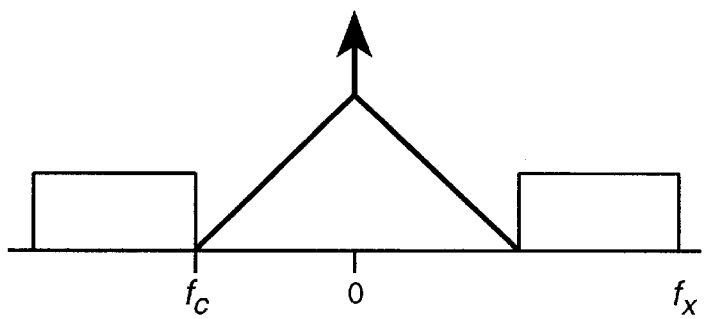
FIG._3B

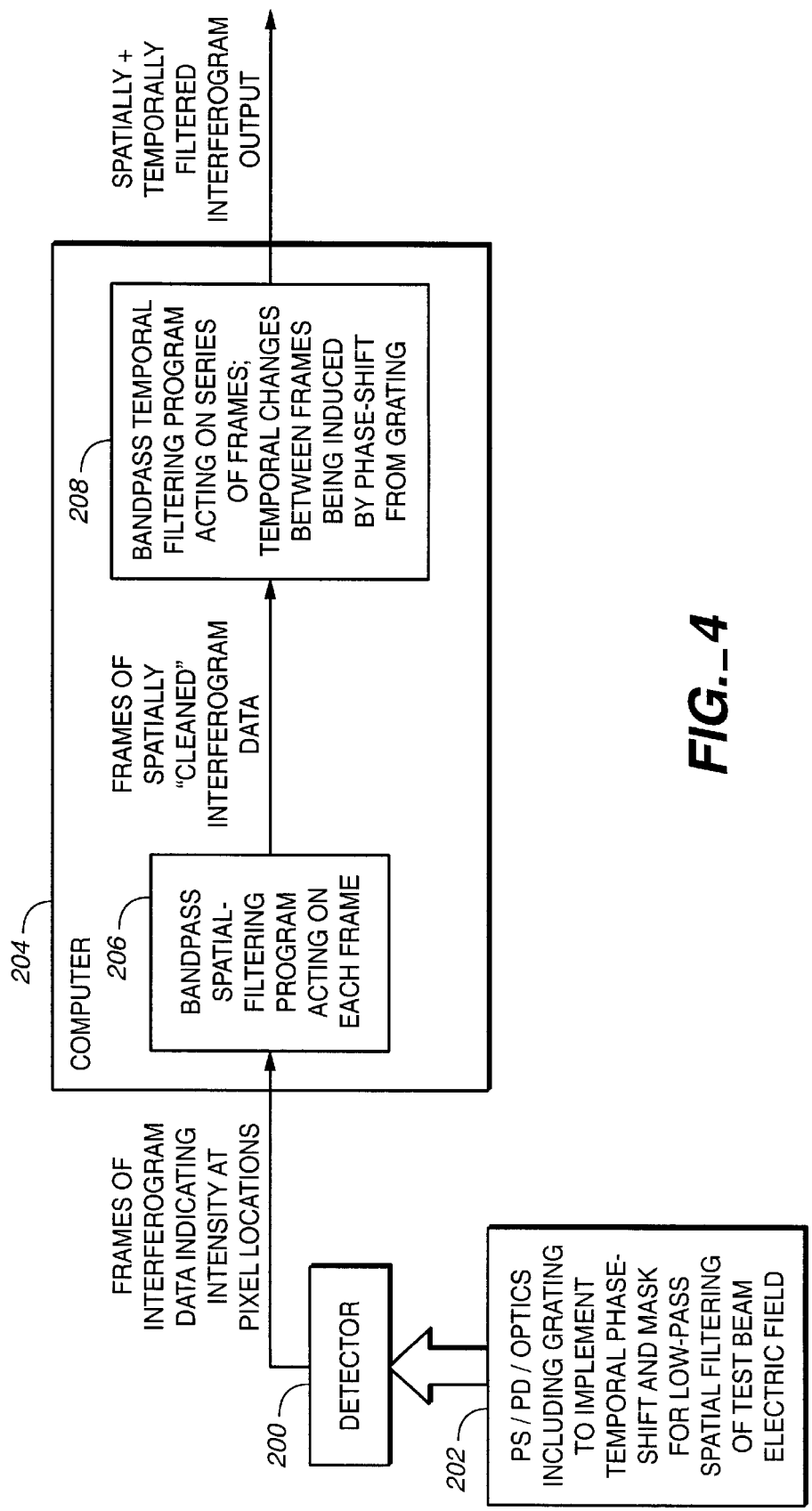
FIG._4

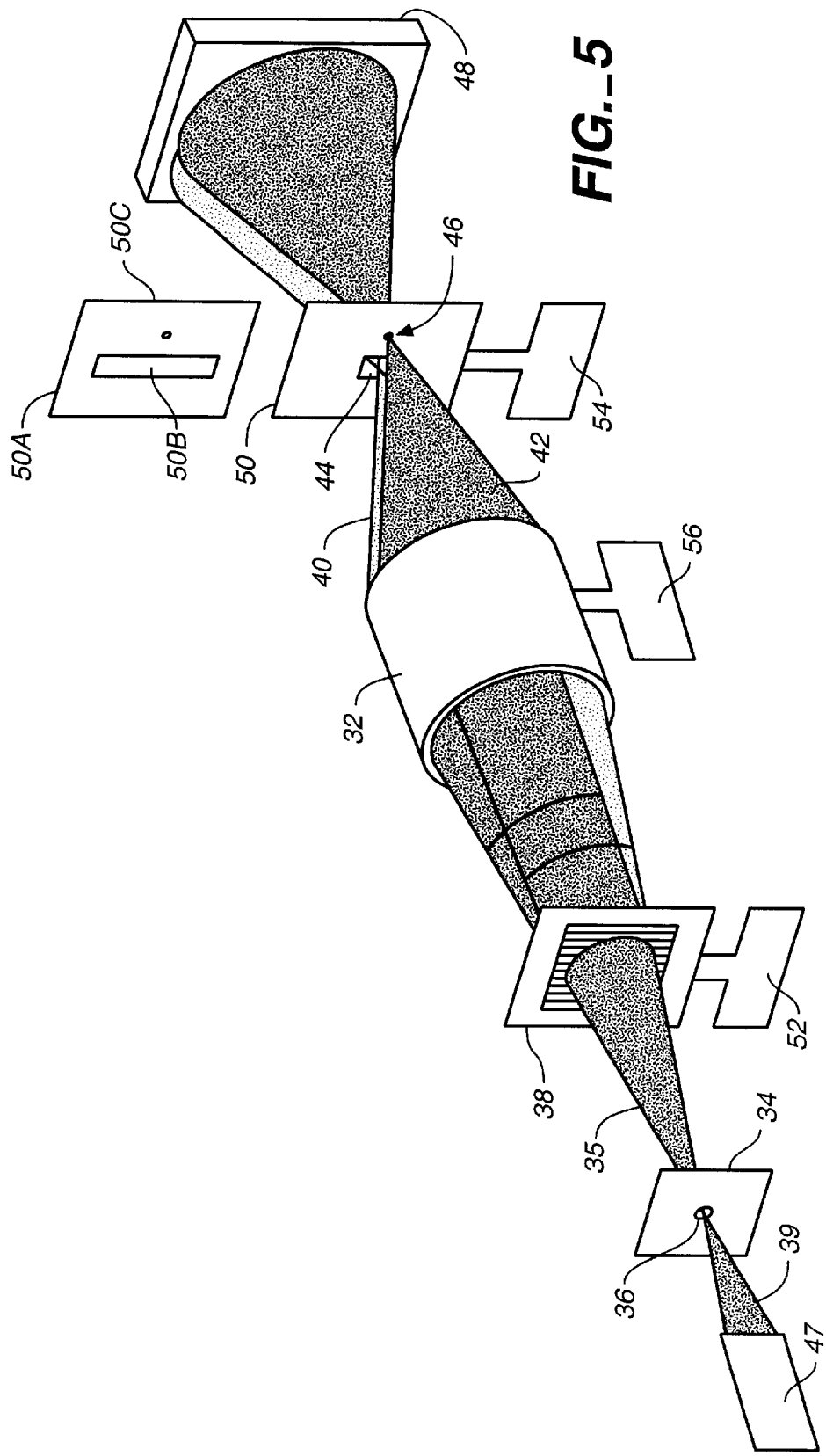
FIG._5

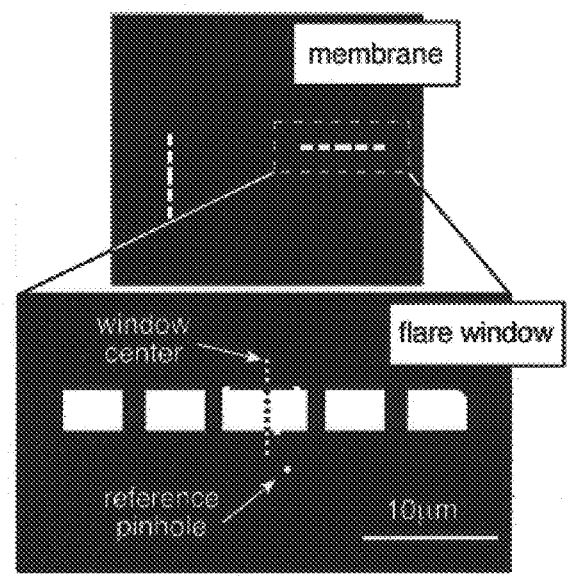
FIG._6A
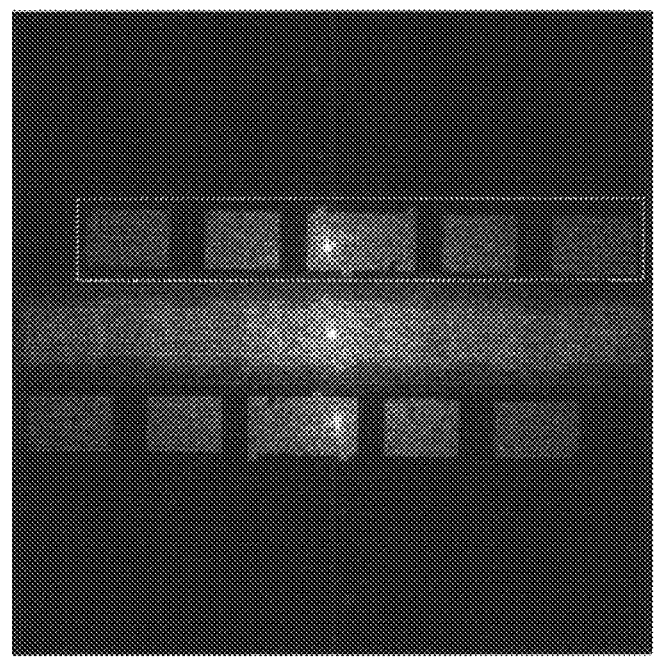
FIG._6B
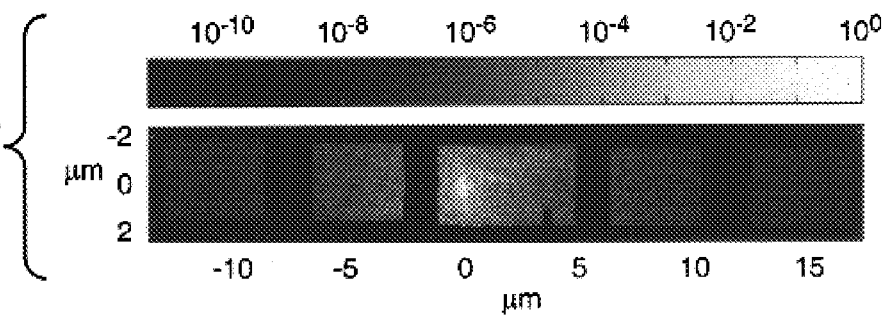
FIG._7

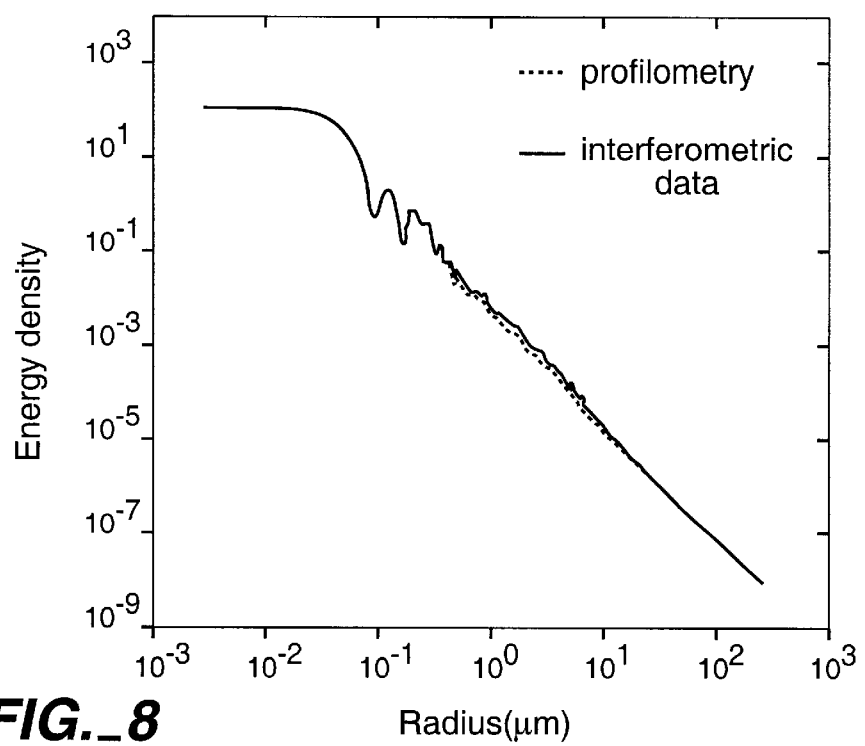
FIG._8
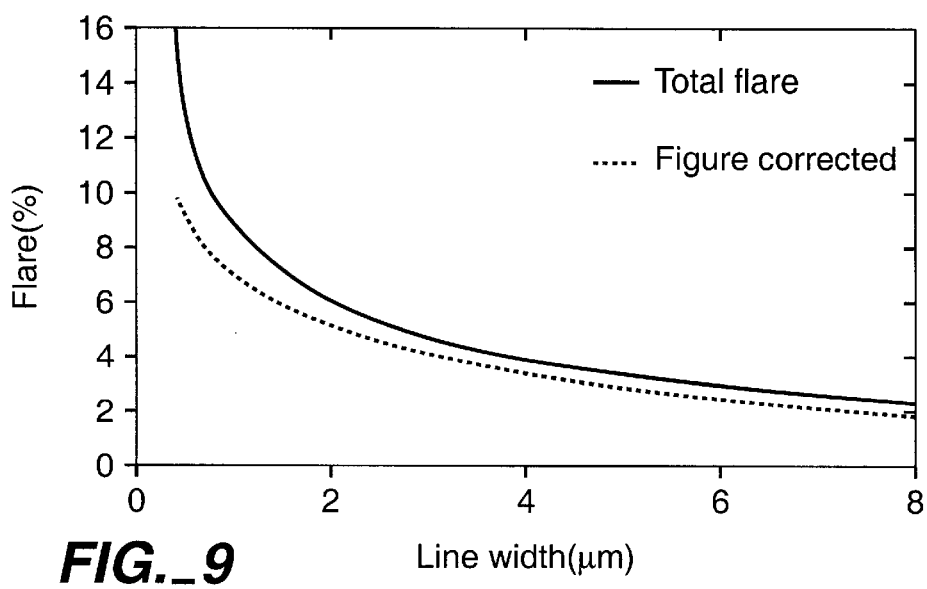
FIG._9

INTERFEROMETRIC AT-WAVELENGTH FLARE CHARACTERIZATION OF EUV OPTICAL SYSTEMS

This application is a continuation of Ser. No. 09/300,539 filed in United States on Apr. 27, 1999 now U.S. Pat. No. 6,100,978, which is a continuation of Ser. No. 09/176,617, filed Oct. 21, 1998 (still pending).

The U.S. Government has certain rights in this invention pursuant to Contract No. DE-AC03-76SF00098 between the United States Department of Energy and the University of California for the operation of the Lawrence Berkeley National Laboratory.

FIELD OF THE INVENTION

The present invention relates to phase-shifting point diffraction interferometers (PS/PDI) that is capable of a system level-flare test that can be performed in parallel with wavefront metrology.

REFERENCES

The following publications are cited in this application as superscript numbers:

1. D. M. Williamson, "The elusive diffraction limit", OSA Proceedings on Extreme Ultraviolet Lithography, Optical Society of America, Washington, D.C., 23, 68–76 (1994).
2. W. Linnik, "A simple interferometer to test optical systems," Proceedings of the Academy of Science of the USSR, 1, 210–212 (1933).
3. R. N. Smartt and W. H. Steel, "Theory and application of point-diffraction interferometers," Jap. J. Appl. Phys., 14, Suppl. 14-1, 351–356 (1975).
4. G. E, Sommargren, "Phase shifting diffraction interferometry for measuring extreme ultraviolet optics," OSA Trends in Optics and Photonics Vol. 4, Extreme Ultraviolet Lithography, G. D. Kubiak and D. R. Kania, eds. (Optical Society of America, Washington, D.C. 1996), pp. 108–112.
5. G. E. Sommargren, "Diffraction methods raise interferometer accuracy," Laser Focus World, 32, 61–71, (August 1996).
6. J. E. Bjorkholm, et al, "Phase-measuring interferometry using extreme ultraviolet radiation," J. Vac. Sci. Technol. B, 13, 2919–2922 (1995).
7. A. K. Ray-Chaudhuri, et al, "Alignment of a multilayer-coated imaging system using extreme ultraviolet Foucault and Ronchi interferometric testing," J. Vac Sci Technol. B, 13, 3089–3093 (1995).
8. H. Medecki, et al, "Phase-shifting point diffraction interferometer," Opt. Lett., 21, 1526–1528 (1996).
9. P. Naulleau et al, "Characterization of the accuracy of EUV phase-shifting point diffraction interferometry," in Emerging Lithographic Technologies II, Yuli Vladimirski, Editor, Proceedings of SPIE Vol. 3331, 114–123, (1998).
10. E. Tejnil, et al, "At-wavelength interferometry for EUV lithography," J. Vac. Sci. Technol. B, 15, 2455–2461 (1997).
11. K. A. Goldberg, et al, "Characterization of an EUV Schwarzschild objective using phase-shifting point diffraction interferometry," in Emerging Lithographic Technologies, David E. Seeger, Editor, Proceedings of SPIE Vol. 3048, 264–270 (1997).
12. P. Carre, "Installation et utilisation du comparateur photoelectric et interferential du bureau international des poids et mesures," Metrologia, 2, 13–17 (1966).
13. R. Crane, "Interference phase measurement," Appl. Opt., 8, 538–542 (1969).
14. J. H. Bruning, et al, "Digital wavefront measuring interferometer for testing optical surfaces and lenses," Appl. Opt., 13, 2693–2703 (1974).
15. M. Takeda, et al, "Fourier-transform method of fringe-pattern analysis for computer-based topography and interferometry," J. Opt. Soc. Am., 72, 156–160 (1982).
16. E. Leith, et al, "Electronic holography and speckle methods for imaging through tissue using femtosecond gated pulses," Appl. Opt., 30, 4204–4210 (1991).
17. K. A. Goldberg, et al, "A 3-D numerical study of pinhole diffraction to predict the accuracy of EUV point diffraction interferometry," OSA Trends in Optics and Photonics Vol. 4, Extreme Ultraviolet Lithography, G. D. Kubiac and D. R. Kania, eds, (Optical Society of America, Washington, D.C. 1996), pp. 133–137.
18. D. A. Tichenor, et al, "Development and characterization of a 10×Schwarzschild system for SXPL," in OSA Proceedings on Soft X-Ray Projection Lithography, Vol. 18, A. M. Hawryluk and R. H. Stulen, eds., (Optical Society of America, Washington, D.C., 1993), pp. 79–82.
19. R. Beguiristain, et al, "High flux undulator beam line optics for EUV interferometry and photoemission microscopy," in High Heat Flux Engineering III, A M Khounsary, Editor, Proceedings of SPIE Vol. 2855, 159–169 (1996).
20. D. Attwood, et al, "Undulator radiation for at-wavelength interferometry of optics for extreme-ultraviolet lithography," Appl. Opt., 32, 7022–7031 (1993).
21. H. Medecki, U.S. Pat. No. 5,835,217 issued Nov. 10, 1998.
22. P. de Groot, "Derivation of algorithms for phase-shifting interferometry using the concept of a data-sampling window," Appl. Opt., 34, 4723–4730 (1995).
23. K. Freischlad and C. Koliopoulos, "Fourier description of digital phase-measuring interferometry," J. Opt. Soc. Am. A, 7, 542–551 (1990).
24. Y. Surrel, "Design algorithms for phase measurements by the use of phase stepping," Appl. Opt., 35, 51–60 (1996).
25. J. Tome and H. Stahl, "Phase-measuring interferometry: applications and techniques," in Optical Testing and Metrology II, Proceedings of SPIE Vol. 954, 71–77 (1988).
26. K. Creath, "Comparison of phase-measuring algorithms" in Surface Characterization and Testing, Proceedings of SPIE Vol. 680, 19–28 (1986).
27. H. Stahl, "Review of phase-measuring interferometry," in Optical Testing and Metrology III: Recent Advances in Industrial Optical Inspection, Proceedings of SPIE Vol. 1332, 71–77 (1990).
28. E. N. Leith and J. Upatnieks, "Reconstructed wavefronts and communication theory", J. Opt. Soc. Am., 52, 1123 (1962).
29. E. N. Leith and J. Upatnieks, "Wavefronts reconstruction with diffused illumination and three-dimensional objects," J. Opt. Soc. Am., 54, 1295 (1964).

All of the above publications are herein incorporated by reference in their entirety to the same extent as if each individual publication was specifically and individually indicated to be incorporated by reference in its entirety.

BACKGROUND OF THE INVENTION

The emergence of extreme ultraviolet (EUV) projection lithography has placed stringent demands on interferometric metrology systems. In order to achieve diffraction-limited performance, EUV lithographic systems require wavefront tolerances on the order of 0.02 waves rms (0.3 nm rms at a wavelength of 13.4 nm).[1] While the accuracy of interferometry is typically limited by the quality of the reference surface or wave, a class of interferometers has been developed in which extremely high quality reference waves are created by diffraction from small apertures.[2–5]

EUV lithographic systems rely on wavelength-specific reflective multilayer coatings. To accurately probe phase effects in these resonant reflective structures, at-wavelength metrology is required. Various at-wavelength interferometric measurement techniques including lateral-shearing interferometry,[6] Foucault and Ronchi testing[7] have been reported. These methods, however, have yet to demonstrate the accuracy required for the development of EUV lithographic imaging systems. In order to meet the accuracy challenge, an EUV-compatible diffraction-class interferometer, the phase-shifting point diffraction interferometer (PS/PDI), was developed by Medecki et al.[8, 21] The reference wavefront accuracy of the PS/PDI has been demonstrated to be better than $\lambda_{EUV}/300$ (0.045 nm) within a numerical aperture of 0.082.[9]

The PS/PDI is a variation of the conventional point diffraction interferometer in which a transmission grating has been added to greatly improve the optical throughput of the system and add phase-shifting capability. In the PS/PDI, as illustrated in FIG. 1A, the optical system 2 under test is illuminated by a spherical wave 5 that is generated by an entrance pinhole 6 in a mask 4 that is placed in the object plane of the optical system 2. To assure the quality of the spherical-wave illumination, pinhole 6 is chosen to be smaller than the resolution limit of the optical system. Grating 8 splits the illuminating beam 5 to create the required test and reference beams 10 and 12, respectively. A PS/PDI mask 20 is placed in the image plane of the optical system 2 to block the unwanted diffracted orders generated by the grating 8 and to spatially filter the reference beam 12 using a reference pinhole 16. The test beam 10, which contains the aberrations imparted by the optical system, is largely undisturbed by the image-plane mask by virtue of it passing through window 14 in the PS/PDI mask 20 that is large relative to the point-spread function (PSF) of the optical system under test. The test and reference beams propagate to the mixing plane where they overlap to create an interference pattern recorded on a CCD detector 18. The recorded interferogram yields information on the deviation of the test beam from the nominally spherical reference beam. FIG. 1B depicts a PS/PDI mask 21 comprising a square shaped window 22 and a reference pinhole 24 to the right which has a diameter of less than 100 nm[8, 10, 11, 21].

The original PS/PDI[8] requires the image-plane beam separation to be sufficient to prevent the reference beam from passing through the test-beam window. For a given separation, this requirement places limits on the scattering and aberrations that can be present in the optic under test. If these limits are not met, the accuracy of the PS/PDI is compromised. It is not feasible to simply increase the image-point separation to strictly meet the above separation requirements due to the unreasonable fringe density this would produce.

Failure to meet this criterion leads to one of the major drawbacks of the PS/PDI: susceptibility to scatter or high-frequency features that can cause confusion of the test and the scattered-reference beams. In the presence of this scattered light, the reference beam is no longer a clean spherical wave, but includes high-frequency features that make the interferometry more difficult. Mid-spatial-frequency features in the wavefront of interest are especially susceptible to this problem.

For lithographic printing using next-generation projection lithography, it is important to consider flare in addition to wavefront error. Flare is the halo of light surrounding the optical system point-spread function (PSF) that is caused by scatter from within the optical system. The grating beamsplitter implementation of the EUV PS/PDI creates multiple image points in the image plane, and can significantly complicate flare measurements attempted using conventional interferometric analysis techniques. For this reason and the drawback described above, the PS/PDI as originally implemented was incapable of accurately measuring the extended spatial-frequency band required to characterize flare.

Prior art system-level at-wavelength flare testing for EUV optics involved printing. Recently, an EUV scatterometry-based method was described in E. Gullikson, et al. "EUV scattering and flare from 10× projection cameras", in Emerging Lithographic Technologies III, Y. Vladimirski, ed., Proc. SPIE, 3676, 717–723 (1999) and E. M. Gullikson, "Scattering from normal incidence EUV optics", in Emerging Lithographic Technologies II, Y. Vladimirski, ed., Proc. SPIE, 3331, 72–80 (1998).

At-wavelength flare predictions for EUV imaging systems were based on scatterometry measurements of the individual mirror elements prior to assembly. This method has the disadvantage of not being a system-level test. Furthermore, the test is not complete because it cannot be performed over the entire spatial-frequency band of interest. Scatterometry requires the use of white-light interferometry and/or other methods to supplement the data. The scatterometry method is not well suited to the measurement of low-spatial-frequency scattering. The art is in need of a system-level at-wavelength technique that can be performed in parallel with wavefront characterization.

SUMMARY OF THE INVENTION

The present invention is based in part on the recognition that because PS/PDI-based wavefront metrology measures the wavefront at the exit pupil of the optical system, it is equivalent to point-spread function (PSF) metrology (the two form a Fourier transform pair). For this reason, the flare can be characterized by using wavefront metrology data if it contains enough spatial-frequency bandwidth, in particular, the mid-spatial-frequency range lying between the ranges commonly referred to as figure and finish. The PS/PDI system of the present invention is designed to meet flare-characterization requirements. Specifically, the invention allows the PS/PDI to be used to quantitatively measure flare in parallel with wavefront measurements.

The present invention allows the EUV PS/PDI to be used to quantitatively determine flare in an optical system under test. In the conventional implementation of the PS/PDI, a grating beamsplitter is used to create several laterally-displaced realizations of the optical system point-spread function (PSF) in the image plane. One of these PSFs (the test beam) is allowed to pass through a large window in the image-plane mask and is used to determine the errors in the optic. Another PSF is cleaned up by way of a pinhole spatial filter in the same image-plane mask and serves as the reference beam allowing phase information to be obtained from the test beam. The remaining PSFs are all blocked by the image-plane mask avoiding confusion in the measurement.

The problem with using this system to measure flare, however, is that all the PSFs contribute to the scattered light passing through the test beam window. To determine the scatter due to the test beam alone it is necessary to eliminate these extraneous scatter terms. This is accomplished in two ways: (1) the dual-domain method (described below) is utilized to remove the dominant scattered light contribution of the reference beam, and (2) the residual contributions from all other PSFs are iteratively predicted and mathematically removed from the measurement. We note also that care must be taken to remove contributions caused by photon and electronic noise.

The interferometric flare-measurement technique of the present invention has advantages over flare measurement techniques based on roughness characterization of individual optical components because it is an integrated system measurement performed at the operational wavelength. Moreover, the interferometric method requires no additional data collection beyond the data currently collected for EUV wavefront metrology. This feature is important because the flare measurement imposes no additional test time requirements and it eliminates the need for a separate test device. The PS/PDI-based system is particularly well-suited for measuring short-range flare (covering distances of less than approximately 500 times the diffraction-limited resolution). For a 0.1 $\mu$m-resolution EUV optical system, this distance is on the order of 50 $\mu$m.

BRIEF DESCRIPTION OF THE DRAWINGS

FIG. 1A is a prior art schematic of the phase-shifting point diffraction interferometer (PS/PDI);

FIG. 1B illustrates an non-optimized (standard prior art configuration) PS/PDI mask;

FIGS. 2A and 2B are the spatial spectra of the field in the recording plane and the recorded irradiance, respectively, for the standard PS/PDI mask case;

FIGS. 3A and 3B are the spatial spectra of the field in the recording plane and the recorded irradiance, respectively, for the spatial-analysis-optimized PS/PDI mask case;

FIG. 4 is a diagram that illustrates operation of one embodiment;

FIG. 5 is a schematic of the PS/PDI showing both the wavefront- and flare-measuring image-plane masks;

FIG. 6 A is a schematic of the 3×30-$\mu$m flare mask used for the measurement;

FIG. 6 B is the logarithmically scaled image of the Fourier transform of a representative hologram from the phase shifting series (the Fourier-transform image represents the reconstructed image of the image-plane distribution; the dashed line highlights one of the holographic twin images);

FIG. 7 is the logarithmically scaled image of the dual-domain-reconstructed intensity PSF (the PSF shown is an average of three independent measurements and invalid-data regions are masked.);

FIG. 8 shows the comparison of the scatter-energy density as a function of radial separation from the PSF peak determined by the PS/PDI- and profilometry-based methods respectively; and FIG. 9 shows the calculated flare in an isolated line as a function of line width with a 250-$\mu$m radius image-field size; also shown is the figure-corrected flare derived by removing the flare that would be calculated given a smooth yet aberrated optic: for the high-quality optics under consideration, this is essentially the flare one would calculate from an ideal Airy pattern, and the figure-corrected flare reveals the flare caused by roughness alone.

DETAILED DESCRIPTION OF THE PREFERRED EMBODIMENTS

The present invention employs an EUV PS/PDI to quantitatively determine flare in an optical system under test. In one embodiment, the invention provides a method whereby the flare added by the additional image points is predicted and removed from the measurement to provide an accurate determination of the flare due to a single image point. Also the effects of detector and photon noise can be determined and removed. The steps of the inventive procedure are summarized as follows:

(1) Employing PS/PDI to collect phase-shifting data interferometric preferably using an elongated test beam window.

(2) Isolating contributions from electronic and photon noise by:
   (A) Using phase-shifting analysis to recover the amplitude and phase of the test beam.
   (B) Reconstructing the image-plane distribution from the recorded wavefront using, for example, a Fourier transform.
   (C) Measuring the electronic photon noise by quantifying the apparent scatter in an area away from the test-beam window.

(3) Removing the reference-beam scatter contribution by:
   (A) Using dual-domain analysis to recover the amplitude and phase of the test beam.
   (B) Reconstructing the image-plane distribution minus the reference beam contribution using the Fourier transform of the wavefront.
   (C) Removing the noise determined in step 2.

(4) Removing the scatter added by the remaining PSFs by:
   (A) Determining the strengths of the PSFs preferably by calculations based on the grating used as the beam splitter, the numerical aperture of the optic under test, and the numerical aperture of the illumination beam; the PSF strengths can also measured experimentally.
   (B) Determining the coupling between scatter from the additional image points and the recorded scatter. Because the grating is used as the phase-shifting device, higher spatial-frequency orders from the grating create additional image points that phase shift at rates proportional to their spatial order. Hence, the zero-order reference beam will not phase shift, the +1 order test beam will phase shift at the rate of the grating motion, the +2 order beam will phase shift at twice the rate of the grating, the negative orders will phase shift in the opposite directions, etc. This fact, along with the known grating phase-shift steps, is used to predict the phase shifting for all the image points. Specifically the predicted phase shifting for each of the image points is used to determine how scatter from said image points will couple to the measurement by running simulated data through the dual-domain analysis process.
   (C) Predicting the spatially-varying-flare contribution added by the additional PSFs by using the relative strengths found in step 4A, coupling efficiencies found in step 4B, and an initial guess for the scatter-energy-density as a function of radial distance from the image point.
   (D) Removing the spatially-varying-flare contribution found in step 4C from the image-plane distribution calculated in step 3.
   (E) Calculating the scatter energy density as a function of radial distance from image point using the result from step 4D.
   (F) Repeat steps 4C through 4E using the calculated energy density radial dependence instead of the initial guess until the radial dependence calculated in step 4E matches that used in step 4C from the previous iteration.

(5) Calculating the flare using the final image-plane distribution resulting from step 4D.

Description of PS/PDI with Flaremask

The preferred PS/PDI of the present invention is an improvement of the conventional PDI in which a transmission grating has been added to greatly enhance the optical throughput of the system and add phase-shifting capability. In the improved PS/PDI, as illustrated in FIG. 5, the optical system 32 under test is coherently illuminated by a spherical wave 35 that is generated by an entrance pinhole 36 in a mask 34 that is placed in the object plane of the optical system 32. In a preferred embodiment, the PS/PDI includes a source of electromagnetic radiation 47 which directs a beam 39 onto object pinhole 36. To assure the quality of the spherical wave illumination, pinhole 36 is chosen to be smaller than the resolution limit of the optical system. Grating 38 splits the illuminating beam 35 to create the required test and reference-beams 40 and 42, respectively. (The grating can be placed either before or after the test optic.) A PS/PDI mask 50 is placed in the image plane of the optical system 32 to block the unwanted diffracted orders generated by the grating 38 and to spatially filter the reference-beam 42 using a reference pinhole 46. The test-beam 40, which contains the aberrations imparted by the optical system, is largely undisturbed by the image plane mask by virtue of it passing through a window 44 in the PS/PDI mask 50 that is large relative to the point spread function of the optical system. The test and reference-beams propagate to the mixing plane where they overlap to create an interference pattern recorded on a CCD detector 48. The recorded interferogram yields information on the deviation of the test-beam from the reference-beam which in the ideal case is a spherical wave. Grating 38 and PS/PDI mask 50 can be mounted on motor actuated stages 52 and 54, respectively, each having suitable rotational, translational, and longitudinal controls for precise maneuvers and alignments. The test optic can also be similarly mounted on stage 56.

The wavefront measurement bandwidth is limited by the size of the image-plane test-beam window. This bandwidth translates directly to the image-plane distance over which the PS/PDI is capable of measuring flare. The flare-measurement capabilities of the PS/PDI become more evident when the PS/PDI is viewed as a system that records an off-axis Fourier-transform hologram of the optical system PSF. Suitable hologram reconstruction techniques are known in the art.[28, 29] From this holography point of view, the PSF, as seen through the test window, is the object distribution. Propagation of the object distribution from the image plane to the CCD in the far field physically performs the Fourier transform function. Furthermore, the reference pinhole provides the off-axis reference beam. Reconstruction of this electronic hologram yields an image of the PSF including the halo. The lateral extent of the image is limited to the size of test window through which it is observed. Thus, the area over which the flare can be determined is simply the area of the test window. In the conventional EUV PS/PDI wavefront-measuring-configuration, this area is typically a square 3–4.5 μm wide.

To increase the flare measurement range, the image-plane window size has to be increased. Unambiguous holographic image reconstruction, however, limits the size of the window in the direction of the beam separation to ⅔ times the pinhole-to-window-center separation or smaller. The optimal window configuration for measuring flare is thus rectangular with preferred dimensions ranging from about 1×10 μm to about 300×5000 μm. In the direction perpendicular to the pinhole separation, where the window can in principle be made arbitrarily long, the flare measurement range is limited by the resolution of the detector and depends on the separation between the image plane and detector. For a detector-to-image-plane separation of 100 mm and a 24-μm detector-element size (typical EUV PS/PDI parameters), this limit corresponds to a full-width measurement range of approximately 50 μm. FIG. 5 depicts a typical flaremask 50A with the test-beam window 50B and reference-beam pinhole 50C. The dimensions of the window, and pinhole will depend on the wavelength of the electromagnetic energy employed.

In general the reference pinhole has a diameter that ranges from about 0.5 to 1 times the diffraction-limited resolution of the optical system under test. In the EUV to IR regime, this is expected to correspond to diameters ranging from 5 nm to 100 μm. Furthermore, typically the test-beam window defines an opening with a width in the direction of the image-plane beam separation that is 20 to 100 times the diffraction-limited resolution of the optical system under test (0.2 μm through 10 mm for the EUV to IR regime). The test-beam window width in the direction that is orthogonal to the direction of beam separation equal to or preferably greater than the width in the direction of beam separation.

Because the PS/PDI derives its reference beam by spatial filtering a laterally displaced copy of the test beam, a significant portion of the scattered light present in the image plane will be due to the pre-filtered reference beam. Simple holographic image reconstruction would erroneously combine the test and scattered-reference light, yielding a deceptively high measure of the flare. This problem can be overcome using the herein described dual-domain analysis method which is also described in P. Naulleau and K. A. Goldberg, "Dual-domain point diffraction interferometer", Appl. Opt., 38, 3523 (1999). The dual-domain method isolates the scattered reference- and test-beam light by recording a set of phase-shifted holograms and processing them in both the temporal and spatial domains.

EXPERIMENTAL

The PS/PDI flare measurement capability was demonstrated using a variety of EUV 10x-demagnification Schwarzschild objectives designed to operate at a wavelength near 13 nm which are described by D. A. Tichenor, et al.[18] The interferometry was performed using an undulator beamline at the Advanced Light Source synchrotron radiation facility at Lawrence Berkeley National Laboratory. The beamline provides a tunable source of partially coherent EUV radiation. The tests were performed at a wavelength of 13.4 nm with a bandwidth, $\lambda/\Delta\lambda$, of approximately 350. The results were obtained from an optic developed to meet a figure specification of better than 0.8 nm and flare specification of less than 5% in a 4-μm line.

The flare mask which is depicted in FIG. 6A was fabricated using electron-beam lithography and reactive-ion etching. The mask is made of a 200-nm-thick Ni absorbing layer evaporated onto a 100-nm-thick $Si_3N_4$ membrane. The features are etched completely through the membrane prior to the Ni evaporation. This leaves the pinholes and windows completely open in the finished mask, thereby maximizing their transmission. The window sizes are 3×30 μm. Two separate orthogonal windows are used, allowing anisotropic flare effects to be measured.

Support bars were added to prevent the thin mask membrane from rupturing. In order to mitigate the obscuring effect of the support bars in the measurement, the reference pinhole is displaced from the window center in the direction parallel to long axis of the window. This in turn allows the test beam to be displaced from the window center during the measurement. A properly chosen displacement eliminates all nulls in the radially averaged PSF data.

The flare-measurement data-collection process involves acquiring a phase-shifting series of holograms (interferograms). The phase shifting is accomplished by lateral translation of the grating beamsplitter between exposures. FIG. 6B shows a logarithmically scaled image of the Fourier transform of a representative hologram from the phase-shifting series. Because these are Fourier-transform holograms, FIG. 6B represents the reconstructed image of the image-plane distribution. The reconstructed image contains the customary twin images and intermodulation image. The dashed line in FIG. 6B highlights one of the twin images, in which the image-plane window is clearly visible. The flare is determined by the test-beam portion of the scatter seen in either one of the twin images. Because simple Fourier-transform reconstruction of the PSF cannot distinguish between scatter in the test beam and scatter in the reference beam, the scatter seen in FIG. 6B is not an accurate representation of the flare. By design, the reference-beam scatter does not phase shift relative to the pinhole-diffracted reference light; thus, it can be completely eliminated using dual-domain processing. The apparent scatter outside the window region is a result of CCD and photon noise contributions. This background noise is also present after dual-domain processing and should be removed before determination of the flare. This can be achieved by measuring and subtracting the average value of the apparent scatter in the region outside the image-plane window. No actual scattered light can be present outside the limiting window, therefor, the apparent scatter in that area is, in fact, noise contribution.

FIG. 7 shows a logarithmically scaled image of the dual-domain-reconstructed intensity PSF. This data was obtained by applying the dual-domain analysis method to the acquired phase-shifting series to recover the complex-amplitude field in the plane of the detector, and then Fourier transforming the field. The PSF shown is an average of three independent measurements. The data dropouts are caused by the bars in the test window. As described above, however, the off-window-center PSF peak ensures that scattering data is available at all radial separations from the PSF peak.

Having calculated the corrected PSF, it is possible to characterize the flare. To this end, the normalized scatter-energy density as a function of radial distance from the PSF peak, S(r) is determined. This is simply the radially averaged PSF.

$$S(r) = \frac{1}{2\pi r} \int PSF(r, \theta) d\theta \qquad (Eq. 1)$$

Performing this calculation on the PSF in FIG. 7 yields an energy density with a radial decay that is well approximated by $r^{-3.1\pm0.01}$. Typically, to implement the present invention the energy density is approximated by $r^{-n}$ wherein n is about 0.01 to 10.

Because the test window is elongated in one direction only, the scatter-energy-density results may be biased if the scatter is anisotropic. To assess the significance of this potential problem, the measurement is repeated using a window oriented in the orthogonal direction. The orthogonal direction is found to have a scatter-energy radial decay well approximated by $r^{-3.03\pm0.05}$. The small difference between the two directions indicates slight anisotropic scattering effects.

Combining the results from the two orthogonal directions leads to the scatter energy depicted in FIG. 8. The imperfect Airy lobes are caused by aberrations in the optic. In order to predict the flare expected in a typical imaging situation, the scatter-energy density must be known over the full radial extent of the field. For the optics considered here, the full field size is 250-μm radius in the image plane. The extended-range scatter-energy density can be obtained by extrapolation of the interferometrically determined data or by use of data derived from profilometry performed on the individual substrates before assembly of the optical system. In order to avoid possible extrapolation errors, the latter was chosen. The plot in FIG. 8 shows an overlay of the scatter-energy density predicted from profilometry. The two measurement methods have overlapping data in the radial range from 1 μm to 16 μm. Good agreement between the two methods is evident.

From the full-field scatter, it is now possible to predict the flare, defined here as $$flare = \frac{E_t - E_s}{E_t}, \qquad Eq. (2)$$

where $E_t$ is the total PSF energy in the field of interest and $E_s$ is the specular energy in the field. The specular energy is defined as the PSF energy contained within the feature size of interest. FIG. 9 shows a plot of the flare in an isolated line as a function of line width for a 250-μm-radius field of view. The flare in a 4-μm line is (3.9±0.1)%. The flare value predicted by profilometry alone is 4.0%. Also shown in FIG. 9 is the figure-corrected flare derived by removing the flare that would be calculated given a smooth yet aberrated optic (figure error only). For high-quality optics, this is essentially the flare one would calculate from the tails of an ideal Airy pattern. Although the figure-corrected flare is not representative of the contrast one might expect in the aerial image, it does reveal the flare caused by roughness alone. The roughness-induced flare in a 4-μm line is 3.4%.

Description of the Dual-Domain Analysis Method
Spatial-Frequency Domain Analysis In the past, PS/PDI data analysis had primarily been performed using a time-domain phase-shifting method.[5,7,8] Owing to the PS/PDI spatial carrier, however, it is also possible to perform the analysis using static-fringe (spatial-domain) methods such as the Fourier-transform method.[15] The application of the Fourier analysis method to PS/PDI data is considered in this section. A more detailed description of the Fourier-transform method can be found in the literature.[15] For the sake of brevity, the following analysis is performed in one dimension, considering only the dimension in the direction parallel to the image-plane beam separation; extension of the analysis to the second lateral dimension is straightforward. The fundamental concepts are identical for, and easily extended to, two dimensions; hence, all the equations subsequently presented could readily be represented in two-dimensional space. Because the method presented here is primarily a filtering process, the analysis is performed in the spacial-frequency domain.

First, the spatial-spectrum of the signal in the detector (recording) plane due to the reference-beam light alone is considered. The reference beam at the detector is a summation of the reference-beam light diffracted by (transmitted through) the reference pinhole and the reference-beam light scattered through the test-beam window and can be written as, $$U_r(f_x) = A\delta(f_x - f_c) + rect\left(\frac{f_x}{W}\right)n(f_x), \quad (3)$$

where $n(f_x)$ is a complex-valued noise function representing the reference-beam light scattered through the test-beam window represented as rect(●), $f_x$ is a variable representing spatial frequency, A is the reference-beam amplitude at the reference pinhole (the pinhole is approximated by δ(●), the Dirac delta function), $f_c$ is the separation between the pinhole and the center of the test-beam window in the spatial-frequency domain, and W is the width of the test-beam window in the spatial-frequency domain. The reference-beam light scattered through the test-beam window [the second term in Eq. (3)] leads to the corruption that needs to be eliminated from the measurement. Owing to the fact that in the PS/PDI there exists a Fourier-transform relationship between the signals in the image and detector planes, Eq. (3) is equivalent to the real-space reference-beam signal in the image plane, where $f_x$ x/(λ·z) with z being the distance between the image and detector planes. For example, an image-plane beam separation of 4.5 μm in a typical EUV implementation, where λ=13.4 nm, and z=130 mm, corresponds to $f_c$=0.0026 lines/μm. Similarly, a window width of 3 μm would correspond to W=0.0017 lines/μm.

As was done with the reference beam, the spatial-spectrum of the test-beam contribution in the detector plane can be expressed as $$U_t(f_x) = rect\left(\frac{f_x}{W}\right)S(f_x), \quad (4)$$

where $S(f_x)$ is the test beam (PSF of the optic under test) including the scattered light in the test beam. The contribution of the test beam to the light passing through the reference pinhole has been ignored owing to its extremely small amplitude. Combining the test- and reference-beam terms in the detector plane yields $$U_r(f_x) = A\delta(f_x - f_c) + rect\left(\frac{f_x}{W}\right)[n(f_x) + S(f_x)], \quad (5)$$

This signal is graphically depicted in FIG. 2A, where the spatial-spectrum shape of the light propagating through the test-beam window [$S(f_x)$] has been ignored.

The signal has been depicted assuming the conventional PS/PDI configuration, where $f_c$ was arbitrarily chosen to be equal to the full-width of the test-beam window. In this configuration, the criterion for choosing $f_c$ and the window width is that the beam separation be much greater than the width of the optical system PSF. This criterion comes from the desire that an insignificant amount of reference-beam light passes through the test-beam window. When notable scatter or high-frequency defects are present in the optic under test and the PSF becomes broad, this criterion is difficult to satisfy due to the large image-plane separation, hence high fringe-density, it would require. Failure to adequately separate the beams is what prevents the conventional implementation of the PS/PDI from accurately measuring flare.

The interferogram that is recorded by the detector is the irradiance, or equivalently the modulus squared of the inverse Fourier transform of $U(f_x)$ [Eq. (5)]. By way of the Autocorrelation Theorem, it is evident that the spatial-spectrum of the recorded signal is the autocorrelation of $U(f_x)$ as depicted in FIG. 2B. The central triangular peak is the zero-order term; this is essentially the irradiance of the light passing through the test-beam window. The two off-axis components are the positive- and negative-first order terms that arise from the interference between the pinhole-diffracted reference beam and the light passing through the test-beam window. Either one of these first-order components can be used to recover the complex amplitude of the light passing through the test-beam window, assuming they are separable from the zero order.

For the purposes of Fourier-domain analysis, there is clearly a problem with the configuration in FIGS. 2A and 2B: the two first order signals are not completely separated from the zero order in the spatial-frequency domain. It is also important to note that in this configuration, high-frequency noise terms from the zero order map to low-frequency terms in the signal because the overlap reaches to the center of the signal passband. For this reason, the original PS/PDI configuration is not particularly well-suited for Fourier-domain analysis, which, strictly speaking, requires full separation of the orders. This aspect is well understood in the realm of electronic holography.[16]

As described above, the depictions in FIGS. 2A and 2B are based on the simplifying assumption of the test beam having a flat spectrum. This assumption leads to significant energy in the wings of the zero order. In practice the test-beam window is chosen to be many times larger than the full-width at half-maximum (FWHM) of the test beam, leading to zero-order wings that are much smaller than those depicted in FIGS. 2A and 2B. If, however, high-accuracy flare characterization is the goal, then full separation over the spatial-frequency band of interest should be guaranteed. This separation can be achieved by increasing the carrier frequency (or equivalently the beam separation) from W to at least 3 W/2. Doing so will increase the fringe density by a factor of 1.5, therefore, more detector resolution may be required. Typically, this has not been a limiting factor. Another consequence of the increased beam separation is an increase in the hyperbolic fringe distortion present in spherical-reference systems. This effect is linear with beam separation and can be predicted, measured, and removed.[9] An alternative to increasing the beam separation is to appropriately reduce the test-beam window size in the direction of beam separation. This would have the effect of reducing the bandwidth of the measurement by a factor of 1.5. In this scenario, there is a tradeoff between measurement bandwidth and scattered-light-noise suppression. Again, typically this is not a limiting factor. The spatial-analysis-optimized configuration, wherein the beam separation has been increased to 3 W/2, is depicted in FIGS. 3A and 3B.

The above analysis is valid in the lateral direction parallel to the image-plane beam separation. The restrictions on the window size do not apply to the direction orthogonal to the beam separation because there is no concern of overlapping orders in this direction. This allows the test-beam window to be made arbitrarily large in the orthagonal direction, enabling the characterization of flare over a large area.

Because the scattered-reference light interfering with the test beam is confined to the zero-order term of the interferogram, this noise term can be isolated from the signal by ensuring that the zero order does not overlap with the first orders. This is accomplished by using a properly configured mask as described above. The Fourier-domain analysis method can then be used to selectively extract the signal free of zero-order corruption using a Fourier-domain digital filter. Having done so, the noise term due to the scattered-reference light interfering with the test beam is eliminated. However, from the presence of $n(f_x)$ in Eq. (5) it is apparent that this is not the entirety of the scattered-reference-light noise. Therefore, the Fourier-domain method alone cannot suppress all scattered-light noise.

Combining Spatial and Temporal Analysis

In this section it is further demonstrated that the Fourier-transform (spatial-domain) analysis method alone cannot fully eliminate the scattered-reference-light noise. Moreover, the assertion made above that the temporal-domain analysis method applied to phase-shifting data also suffers from scattered-reference-light noise is established. Finally, the hybrid spatial/temporal processing technique (the dual-domain method) capable of completely eliminating the scattered-reference-light corruption problem is described in detail.

In order to facilitate the following discussion, the various interference components are defined as follows according to their spatial-frequency content while distinguishing the signal of interest from noise terms.

1. Signal, $rect\left(\dfrac{f_x - f_c}{W}\right) S(f_x - f_c)$:

the pinhole-diffracted reference beam interfering with the test beam propagating through the test-beam window.

2. Baseband-noise $rect\left(\dfrac{f_x}{W}\right) n(f_x) \otimes rect\left(\dfrac{f_x}{W}\right) S(f_x)$, :

where $\otimes$ represents the cross-correlation operator. This is the reference beam scattered through the test-beam window interfering with the test beam. The spatial spectrum of this noise term is limited to the autocorrelation width of the test-beam window and is centered at zero spatial frequency, hence it is referred to as baseband-noise.

3. Passband-noise $rect\left(\dfrac{f_x - f_c}{W}\right) n(f_x - f_c)$:

reference beam scattered through the test-beam window interfering with the pinhole-diffracted reference beam. The spatial spectrum of this noise term is confined to the same spatial-frequency region as the signal, hence it is called passband-noise.

In order to gain better understanding of the scattered-reference-light corruption problem for the spatial- and temporal-domain-analysis methods respectively, the recorded interferogram is considered in more detail. The method presented here relies on the frequency-domain separability of the signal and noise terms, therefore it is best to express the recorded interferogram in the frequency domain as opposed to the more conventional $a(x)+b(x) \cos[2\pi f_c + c(x)]$ spatial form. This approach is routinely used in the realm of Fourier optics and more specifically holography. From this point of view, the recorded interferogram is seen in terms of interferometric orders, where the modulated light makes up the positive- and negative-first orders and the unmodulated light makes up the zero order.

The spatial-frequency-domain (Fourier) analysis from the previous section is first considered in more detail. The spectrum of the recorded interferogram consists of the autocorrelation of Eq. (5) and can be written in the form $\{\delta(f_x) + \Gamma[a(f_x)]\} + a(f_x + f_c) + a^*(f_x - f_c)$, where $\Gamma[a(f)]$ is defined as the autocorrelation of $a(f)$. These three terms are the zero order and the positive- and negative-first order, respectively as depicted earlier in FIGS. 2B and 3B. Performing this operation on Eq. (5), the interferometric orders of interest are found to be:

$$\text{first order} = rect\left(\dfrac{f_x - f_c}{W}\right)[n(f_x - f_c) + S(f_x - f_c)] \quad (6a)$$

$$\text{zero order} = \delta(f_x) + \Gamma\left\{rect\left(\dfrac{f_x}{W}\right)[n(f_x) + S(f_x)]\right\} \quad (6b)$$

Relative amplitudes have been ignored because they are irrelevant to this presentation. The Fourier-domain analysis consists simply of extracting the first order using a bandpass filter in the spatial-frequency domain and performing the inverse Fourier transform.[15] In this case, even if the spatial-order-separation problem discussed above is corrected by setting $f_c$ to 3 W/2 instead of W, there is the corruption problem caused by the appearance of both the signal and passband-noise in the first spatial-order of the interferogram.

Next it is shown that temporal-domain analysis of phase-shifting interferometric data is also susceptible to the deleterious effects of beam overlap in the image plane. To perform temporal-domain analysis, a series of interferograms with varying phase-shifts between the test and reference beams is required. Demodulation is then performed on a pixel-by-pixel basis by examining the evolution of the intensity at each pixel throughout the temporal series of interferograms. Because temporal-domain analysis of phase-shifting data is essentially a temporal-filtering process and it is the frequency-domain separability of the signal and noise terms that is of interest, it is useful to express the signal in both temporal-frequency and spatial-frequency domains. To this end Eq. (5) is rewritten to include temporal frequency, v.

$$U(f_x, v) = A\delta(f_x - f_c, v - v_c) + rect\left(\dfrac{f_x}{W}\right)[n(f_x)\delta(v - v_c) + S(f_x)\delta(v)]. \quad (7)$$

Equation (7) is the spectrum of the electric field in the detector plane in both the spatial and temporal domains, where without loss of generality it is assumed that the phase-shifting occurs on the reference beam alone and $v_c$ is the temporal carrier frequency set by the number of phase-shifting cycles contained in the phase-shifting series.

To see the effect of the temporal-filtering process, the recorded interferogram time series is expressed as interferometric orders in the temporal domain. The spectrum of the recorded interferograms consists of the autocorrelation of Eq. (7) and can be separated into interferometric temporal-orders as, $$\text{first order} = \left[rect\left(\dfrac{f_x - f_c}{W}\right) S(f_x - f_c) + \right. \quad (8a)$$
$$\left. rect\left(\dfrac{f_x}{W}\right) n(f_x) \otimes rect\left(\dfrac{f_x}{W}\right) S(f_x)\right]\delta(v - v_c)$$

$$\text{zero order} = \left\{\Gamma\left[rect\left(\dfrac{f_x}{W}\right) n(f_x)\right] + \right. \quad (8b)$$
$$\left. \Gamma\left[rect\left(\dfrac{f_x}{W}\right) S(f_x)\right] + rect\left(\dfrac{f_x - f_c}{W}\right) n(f_x - f_c) + \delta(f_x)\right\}\delta(v)$$

This is analogous to the representation in Eq. (6), where now the first order contains the time-varying (phase-shifting modulated) intensity and the zero order contains the static (dc or unmodulated) component. The first temporal-order is used to determine the phase at each pixel. Equation (8a) shows that both the signal and baseband-noise contribute to the reconstructed wavefront. The presence of the baseband-noise in Eq. (8a) is the PS/PDI scatter problem mentioned above. The passband-noise, however, appears only in the zero temporal-order and thus does not contribute to the wavefront reconstructed by the temporal-domain-analysis method.

Although neither the Fourier-transform-analysis (static-fringe) nor the temporal-domain-analysis methods alone can fully eliminate the scattered-reference-light noise, it is important to note that as the reference pinhole gets smaller, making the reference beam weaker, the temporal-domain-analysis method becomes more vulnerable to the scattered-light noise, whereas the static-fringe-analysis method does not. This is because the energy contained in both the signal and the passband-noise diminish proportionally as the pinhole-diffracted reference light diminishes; thus, the scattered-light-induced signal-to-noise ratio (SNR) in the static-fringe-analysis method, which suffers from passband-noise corruption, is independent of pinhole size. On the other hand, the baseband-noise energy is independent of the energy in the pinhole-diffracted reference beam; thus, the scattered-light-induced SNR in the temporal-domain-analysis case drops as the pinhole-diffracted reference light diminishes (the pinhole gets smaller). This is problematic because the fundamental accuracy (reference-wave limited accuracy) of the PS/PDI improves as the reference pinhole gets smaller,[9,17] but at the same time, the temporal-domain-analysis method becomes more vulnerable to scattered-reference-light noise. Turning to the spatial-domain method alone is not the optimal solution because it lacks many of the beneficial attributes of the phase-shifting method and, as shown above, it is not completely free of scattered-reference-light noise.

Here it is shown that it is possible to perform the analysis in such a way that the phase-shifting benefits are maintained while suppressing all scattered-reference-light noise. Examination of Eqs. (6) and (8) shows that combining the two analysis methods can entirely eliminate scattered-reference-light noise, assuming complete spatial-order separation is guaranteed. This is due to the fact that the only term to appear in the first order of both domains (Eqs. (6a) and (8a)) is $$rect\left(\frac{f_x - f_c}{W}\right) S(f_x - f_c),$$

the isolated signal term.

Recovering the signal free of both baseband-noise and passband-noise is now straightforward. Digitally applying a spatial domain zero-order-blocking filter to each recorded element of the temporal (phase-shifting) series will eliminate the baseband-noise. This can alternatively be implemented as bandpass filters centered on the first orders of each recorded interferogram. When the spatial carrier is properly chosen there is a natural zero (imposed by the physical test-beam window in the PS/PDI mask) in the spatial spectrum at the ends of the zero order; therefore, imposing a digital filter after recording of the interferogram is no more restrictive than the physical window itself and no spatial-frequency content is sacrificed. At this point, the process has generated series of filtered interferograms in which the baseband-noise has been suppressed. This is simply a bandpass spatial-filtering process, no phase recovery has yet occurred. The cleaned interferograms can be represented as a set in the spatial/temporal frequency domain as $$\iota(f_x, v) = rect\left(\frac{f_x - f_c}{W}\right)[n(f_x - f_c)\delta(v) + S(f_x - f_c)\delta(v - v_c)] + \quad (9)$$

$$rect\left(\frac{f_x + f_c}{W}\right)[n^*(f_x + f_c)\delta(v) + S^*(f_x + f_c)\delta(v - v_c)],$$

Alternatively, the recorded signal can be rewritten as a function of time at some arbitrary spatial location $x_0$ as $$I(t) = N(x_0) + |s(x_0)| \cos[2\pi v_c t + Ls(x_0)], \quad (10)$$

where $N(x)$ is the inverse Fourier transform of $n(f_x)$, $s(x)$ is the inverse Fourier transform of $S(f_x)$, and $Ls(x)$ is the phase of $s(x)$.

Although at this point the baseband-noise term is suppressed, the spatially modulated noise term (passband-noise) remains. Because the remaining passband-noise is separable from the signal in the temporal-frequency domain as is evidenced by Eqs. (9) and (10), the signal free of any scattered-reference-light noise can be recovered by performing the usual temporal-domain analysis on the phase-shifting data. In the dual-domain analysis case the scattered-reference-noise suppression properties of both individual methods are simultaneously realized. In addition, the benefits of the phase-shifting method are realized.[12–14]

It has previously been stated that the PS/PDI is not well-suited to testing systems with relatively large aberrations.[8] This statement came from the requirement of having adequate separation of the PSFs in the image plane in order to prevent the reference beam from passing through the test-beam window. Noting that large aberrations that cause reference light to pass through the test-beam window are fundamentally no different than scatter causing reference light to pass through the window, it is evident that the dual-domain implementation, with properly configured mask, extends the usefulness of the PS/PDI to larger aberrations. Although the dual-domain technique is still limited by the measurement bandwidth constraints imposed by the test-beam window, spurious interference terms limiting the accuracy of the measurement are suppressed.

FIG. 4 is a diagram that illustrates the operation of one embodiment of the dual-domain PS/PDI data collection and processing system. A detector 200 detects an interferogram produced by the optic under test 202. The interferogram changes over time as a result of the phase-shifting caused by lateral translation of the grating. The detector 200 produces an output that is sent to a computer 204. The output consists of a number of frames (at least 3) of data produced at different times. Each frame has an intensity value for each pixel of the detector.

A spatial-filtering program 206 residing in the computer 204 spatially filters each recorded frame separately as described above. The spatial-filtering program 206 produces frames of spatially "cleaned" data; the scattered-light noise arising from the scattered-reference-light interfering with the test beam has been eliminated.

A program implementing a phase-shifting-interferometry algorithm (temporal-domain processing) 208 uses the series of "cleaned" frames to produce the wavefront output. This step simultaneously acts as a temporal filtering step, removing the scattered-light noise arising from the scattered-reference light interfering with the "true" pinhole-diffracted reference light.

The dual-domain can be viewed as combining two previously used methods in a prescribed manner, achieving better results than possible with either method alone.

Although only preferred embodiments of the invention are specifically disclosed and described above, it will be appreciated that many modifications and variations of the present invention are possible in light of the above teachings and within the purview of the appended claims without departing from the spirit and intended scope of the invention.

What is claimed is:

1. A method of simultaneously measuring flare and test-beam wavefront in an optical element employing a phase-shifting point diffraction interferometer (PS/PDI) that defines an optical path that includes (i) a source of electromagnetic radiation in the optical path that provides an illumination beam, (ii) an optical system under test in the optical path, (iii) a beam divider comprising gratings in the optical path for dividing the electromagnetic radiation from the source into a test beam and a reference beam, and (iv) an irradiance detector in the optical path downstream from the optical element under test, comprising the steps of:
    (a) employing the PS/PDI to collect phase-shifting interferometric data;
    (b) isolating contributions from electronic and photon noise;
    (c) removing reference-beam flare and noise contribution by:
        (i) employing dual-domain analysis to recover an amplitude and phase of the test beam;
        (ii) reconstructing an image-plane point-spread function (PSF) free of reference beam flare contribution from the wavefront of step c(i); and
        (iii) removing electronic and photon noise determined from step b;
    (d) removing flare added by remaining PSFs; and
    (e) calculating the flare.

2. A method of simultaneously measuring flare and test-beam wavefront in an optical element employing a phase-shifting point diffraction interferometer (PS/PDI) that defines an optical path that includes (i) a source of electromagnetic radiation in the optical path that provides an illumination beam, (ii) an optical system under test in the optical path, (iii) a beam divider comprising gratings in the optical path for dividing the electromagnetic radiation from the source into a test beam and a reference beam, and (iv) an irradiance detector in the optical path downstream from the optical element under test, comprising the steps of:
    (a) employing the PS/PDI to collect phase-shifting interferometric data;
    (b) isolating contributions from electronic and photon noise by:
        (i) performing phase-shifting analysis to recover amplitude and phase of the test beam;
        (ii) reconstructing an image-plane point-spread function (PSF) which includes contamination from flare and noise from the wavefront of step b(i); and
        (iii) measuring apparent scatter in an area away from the test-beam window to determine electronic and photon noise;
    (c) removing reference-beam flare and noise contribution by:
        (i) employing dual-domain analysis to recover an amplitude and phase of the test beam;
        (ii) reconstructing an image-plane PSF free of the reference-beam flare contribution from the wavefront of step c(i); and
        (iii) removing electronic and photon noise determined in step b(iii);
    (d) removing the flare added by remaining PSFs by:
        (i) determining the strengths of the PSFs based on parameters of the grating beam divider, the numerical aperture of the optic under test, and the numerical aperture of the illumination beam;
        (ii) determining the coupling between scatter from the additional image points and the recorded scatter;
        (iii) predicting the spatially-varying-flare contribution from the nonzero order diffraction orders by using the relative strengths determined in step d(i), coupling efficiencies determined in step d(ii), and an initial guess for the scatter-energy-density as a function of radial distance from the image point;
        (iv) removing the spatially-varying-flare contribution predicted in step d(iii) from the image-plane distribution calculated in step c to obtain a PSF free of flare contribution from the reference beam and partially corrected for flare from the other image points;
        (v) calculating scatter-energy-density as a function of radial distance from image point using the approximate result from step d(iv); and
        (vi) repeating steps d(iii) through d(v) using the calculated energy density radial dependence until the radial dependence calculated in step d(v) substantially matches that used in step d(iii) from a previous iteration; and
    (5) calculating the flare using the final image-plane distribution resulting from step d(iv).

3. The method of claim 2 wherein the PS/PDI includes a flare-optimized mask that has an enlarged test-beam window which increases the wavefront measuring bandwidth, thereby increasing the distance over which the PS/PDI is capable of measuring flare.

4. The method of claim 3 wherein the flare-optimized mask has a test-beam window that is rectangular, elongated in the direction orthogonal to the direction of beam separation.

5. The method of claim 3 wherein the flare-optimized mask has a test-beam window that is rectangular with dimensions ranging from about 1×10 $\mu$m to about 300×5000 $\mu$m.

6. The method of claim 2 wherein the PS/PDI includes a flare-optimized mask having two orthogonal window/pinhole pairs to allow measuring anisotropic effects.

7. The method of claim 2 wherein dual domain analysis of step c(i) comprises the steps of:
    (1) directing a source of radiation toward a test element provided in a test optic region of the point diffraction interferometer, the test element having an image plane located downstream from the test optic;
    (2) dividing the source radiation into at least a reference beam and a test beam directed at different angles with respect to one another such that the reference beam impinges at a first location on the image plane and the test beam impinges at a second location, laterally separated from the first location, on the image plane;
    (3) phase-shifting at least one of the reference beam and the test beam;
    (4) passing the reference beam through a reference pinhole on a mask that is positioned at the image plane of the test optic to produce a reference wave and passing the test beam through a test-beam window on the mask to produce a test wave;
    (5) recording a set of interference patterns (interferograms), with relative phase shifts between each element of the set, wherein the interferograms are produced by combining the reference wave and the test wave while phase shifting either the test wave or reference wave; and (6) recovering a test-beam wavefront by processing the recorded interferograms in both the temporal and spatial domains.

8. The method of claim 2 wherein the separation between the center of the test-beam window and the center of the reference pinhole is sufficiently large relative to the full width of the test-beam window to achieve full separation of the first and zero order components of the recorded interferograms in the spatial-frequency domain.

9. The method of claim 7 wherein step 6 comprises (1) bandpass spatial-filtering individual interferograms irradiance frames comprising a phase-shifting series, and (2) using time-domain-based techniques to recover the test-beam wavefront from the resulting filtered phase-shifting series.

10. The method of claim 9 wherein the separation between the center of the test-beam window and the center of the reference pinhole is sufficiently large relative to the full width of the test-beam window to achieve full separation of the first and zero order components of the recorded interferograms in the spatial-frequency domain.

11. A method for simultaneously measuring flare and test-beam wavefront in an optical element by employing a phase-shifting point diffraction interferometer (PS/PDI) that defines an optical path that includes (i) a source of electromagnetic radiation in the optical path, (ii) an optical system under test in the optical path, (iii) a beam divider comprising gratings in the optical path for dividing the electromagnetic radiation from the source into a test beam and a reference beam, and (iv) an irradiance detector in the optical path downstream from the optical element under test that comprises the steps of:

(a) using the PS/PDI to collect phase-shifting interferometric data;

(b) performing phase-shifting analysis to recover a wavefront and calculating from said wavefront the image-plane point-spread function (PSF) which includes contributions from detector and photon noise;

(c) determining detector and photon noise by measuring the energy density in an area far from the window-limited PSF of step (b);

(d) performing a dual-domain phase-shifting analysis to reconstruct a wavefront which is free of flare contributed from the reference beam;

(e) calculating a partially corrected PSF free of reference-beam flare contributions from the wavefront of step (d);

(f) removing the detector and photon noise determined in step (c);

(g) determining the strengths of the image points from different grating diffraction orders;

(h) using predicted phase shifts of image points from each grating diffraction order to determine how flare from said image points will couple to the measurement;

(i) predicting the spatially varying flare contribution from the non-zero order diffraction points by using the results from steps (g), (h), and an assumed functional form for the scattered-energy-density as a function of distance from the image point;

(j) removing the flare contribution predicted in step (i) from the dual-domain reconstructed PSF to obtain a PSF free of flare contribution from the reference beam and partially corrected for flare from the other image points;

(k) using the partially corrected PSF of step (j) to obtain an improved functional form for the scattered-energy-density; and (l) repeating of steps (i), (j), and (k) until the functional form for the scattered-energy-density converges on a self consistent solution.

12. The method of claim 11 wherein the PS/PDI includes a flare-optimized mask that has an enlarged test-beam window which increases the wavefront measuring bandwidth, thereby increasing the distance over which the PS/PDI is capable of measuring flare.

13. The method of claim 12 wherein the flare-optimized mask has a test-beam window that is rectangular, elongated in the direction orthogonal to the direction of beam separation.

14. The method of claim 12 wherein the flare optimized mask has a test-beam window that is rectangular with dimensions ranging from about 1×10 $\mu$m to about 300×5000 $\mu$m.

15. The method of claim 11 wherein the PS/PDI includes a flare-optimized mask having two orthogonal window-pinhole pairs to allow measuring anisotropic effects.

16. The method of claim 11 wherein the functional form of step (i) and (k) follows an inverse power law in distance from the image point which is defined as $r^{-n}$, wherein n is about 0.01 to 10.

17. The method of claim 11 wherein the functional form in (i) is $r^{-n}$, wherein n is about 0.01 to about 10 and the functional form in step (k) is $r^{-m}$, wherein m is about 0.01 to about 10.

18. The method of claim 11 where in the functional form of step (i) and the function form of step (k) are defined by numerical enumeration at tabulated distances and interpolated at intermediate distances.

19. The method of claim 11 wherein step (h) comprises running simulated data through the dual-domain analysis process.

20. The method of claim 11 wherein dual-domain analysis of step (d) comprises the steps of:

(i) directing a source of radiation toward a test element provided in a test optic region of the point diffraction interferometer, the test element having an image plane located downstream from the test optic;

(ii) dividing the source radiation into at least a reference beam and a test beam directed at different angles with respect to one another such that the reference beam impinges at a first location on the image plane and the test beam impinges at a second location, laterally separated from the first location, on the image plane;

(iii) phase-shifting at least one of the reference beam and the test beam;, (iv) passing the reference beam through a reference pinhole on a mask that is positioned at the image plane of the test optic to produce a reference wave and passing the test beam through a test-beam window on the mask to produce a test wave;

(v) recording a set of interference patterns (interferograms), with relative phase shifts between each element of the set, wherein the interferograms are produced by combining the reference wave and the test wave while phase shifting either the test wave or reference wave; and (vi) recovering a test-beam wavefront by processing the recorded interferograms in both the temporal and spatial domains.

21. The method of claim 20 wherein the separation between the center of the test-beam window and the center of the reference pinhole is sufficiently large relative to the full width of the test-beam window to achieve full separation of the first and zero order components of the recorded interferograms in the spatial-frequency domain.

22. The method of claim 20 wherein step (vi) comprises (1) bandpass spatial-filtering individual interferograms irradiance frames comprising a phase-shifting series, and (2) using time-domain-based techniques to recover the test-beam wavefront from the resulting filtered phase-shifting series.

23. The method of claim 22 wherein the separation between the center of the test-beam window and the center of the reference pinhole is sufficiently large relative to the full width of the test-beam window to achieve full separation of the first and zero order components of the recorded interferograms in the spatial-frequency domain.

24. The method of claim 22 wherein the bandpass filter, as defined in the spatial-frequency domain, is (1) substantially equal to the test-beam window size as defined in the spatial-frequency domain and (2) is centered on the positive- and/or negative-first orders of the recorded interferograms.

25. The method of claim 20 wherein step (vi) comprises (1) using time-domain-based techniques to recover the complex amplitude of the test beam from the phase-shifting series, and (2) bandpass spatial-filtering the resulting complex amplitude to extract the test-beam wavefront.

26. The method of claim 25 wherein the separation between the center of the test-beam window and the center of the reference pinhole is sufficiently large relative to the full width of the test-beam window to achieve full separation of the first and zero order components of the recorded interferograms in the spatial-frequency domain.

27. The method of claim 20 wherein step (vi) comprises embedding a bandpass spatial-filtering process into a time-domain technique algorithm, thereby, simultaneously processing the data in both the temporal and spatial domains.

28. The method of claim 27 wherein the bandpass filter, as defined in the spatial-frequency domain, is (1) essentially equal to the test-beam window size as defined in the spatial-frequency domain and (2) is centered on the positive- and/or negative-first orders of the recorded interferograms.

29. The method of claim 22 wherein the bandpass filter, as defined in the spatial-frequency domain, is (1) substantially equal to the test-beam window size as defined in the spatial-frequency domain and (2) is centered on the positive- and/or negative-first orders of the recorded interferograms.

30. The method of claim 20 wherein step (vi) comprises (1) using time-domain-based techniques to recover the complex amplitude of the test beam from the phase-shifting series, and (2) bandpass spatial-filtering the resulting complex amplitude to extract the test-beam wavefront.

31. The method of claim 25 wherein the separation between the center of the test-beam window and the center of the reference pinhole is sufficiently large relative to the full width of the test-beam window to achieve full separation of the first and zero order components of the recorded interferograms in the spatial-frequency domain.

32. The method of claim 20 wherein step (vi) comprises embedding a bandpass spatial-filtering process into a time-domain technique algorithm, thereby, simultaneously processing the data in both the temporal and spatial domains.

33. The method of claim 27 wherein the bandpass filter, as defined in the spatial-frequency domain, is (1) essentially equal to the test-beam window size as defined in the spatial-frequency domain and (2) is centered on the positive- and/or negative-first orders of the recorded interferograms.

\* \* \* \* \*